US008067514B2

(12) United States Patent
Miyauchi et al.

(10) Patent No.: US 8,067,514 B2
(45) Date of Patent: Nov. 29, 2011

(54) ANISOTROPIC CONDUCTIVE FILM

(75) Inventors: Kouichi Miyauchi, Tochigi (JP);
Yasushi Akutsu, Tochigi (JP);
Yasunobu Yamada, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 349 days.

(21) Appl. No.: 12/227,164

(22) PCT Filed: Jan. 17, 2008

(86) PCT No.: PCT/JP2008/050483
§ 371 (c)(1),
(2), (4) Date: Nov. 10, 2008

(87) PCT Pub. No.: WO2008/090791
PCT Pub. Date: Jul. 31, 2008

(65) Prior Publication Data
US 2009/0107625 A1    Apr. 30, 2009

(30) Foreign Application Priority Data

Jan. 22, 2007   (JP) ................. 2007-011592

(51) Int. Cl.
*C08F 4/38* (2006.01)
*C08G 63/91* (2006.01)
*B32B 37/06* (2006.01)
*B32B 37/12* (2006.01)
*C08K 3/10* (2006.01)

(52) U.S. Cl. .................. 526/228; 526/232.1; 524/435; 525/27; 252/514; 156/273.9

(58) Field of Classification Search .................. 524/435; 526/228, 232.1; 252/514
See application file for complete search history.

(56) References Cited

U.S. PATENT DOCUMENTS

| 6,194,492 B1 * | 2/2001 | Sakurai et al. ............... 523/515 |
| 2001/0011575 A1 * | 8/2001 | Nakata et al. ............... 156/272.2 |
| 2002/0109124 A1 * | 8/2002 | Ishimatsu ..................... 252/500 |
| 2005/0136246 A1 * | 6/2005 | Hiraoka et al. ............... 428/323 |
| 2005/0238879 A1 | 10/2005 | Shoshi et al. |
| 2006/0153981 A1 * | 7/2006 | Husemann et al. ......... 427/208.4 |
| 2009/0233102 A1 | 9/2009 | Toyama et al. |

FOREIGN PATENT DOCUMENTS

| JP | A-10-168412 | 6/1998 |
| JP | A-2001-31916 | 2/2001 |
| JP | A-2005-144699 | 6/2005 |
| JP | A-2006-199825 | 8/2006 |
| KR | 10-2005-0045873 A | 5/2005 |
| WO | WO 2005/121266 A1 | 12/2005 |
| WO | WO 2006/059490 A1 | 6/2006 |

OTHER PUBLICATIONS

Office Action issued in Korean Patent Application No. 10-2009-7001050 on Feb. 14, 2011 (w/English-language Translation).

* cited by examiner

*Primary Examiner* — Tae H Yoon
(74) *Attorney, Agent, or Firm* — Oliff & Berridge, PLC

(57) ABSTRACT

An anisotropic conductive film is provided which can provide high bonding strength and good conduction reliability when anisotropic conductive bonding is made under the compression bonding conditions of a compression bonding temperature of at most 130° C. for a compression bonding time of at most 3 seconds. The anisotropic conductive film contains a polymerizable acrylic compound, a film-forming rein, conductive particles, and a polymerization initiator. The polymerization initiator contains two types of organic peroxides that do not produce oxygen gas resulting from the decomposition thereof and have different one-minute half-life temperatures. Of the two types of organic peroxides, one organic peroxide that has a higher one-minute half-life temperature produces benzoic acid or a derivative thereof when it decomposes.

6 Claims, 1 Drawing Sheet

ANISOTROPIC CONDUCTIVE FILM

TECHNICAL FIELD

The present invention relates to an anisotropic conductive film, to a connection structure using the same, and to a method for manufacturing the connection structure.

BACKGROUND ART

Generally, to connect an ITO electrode formed on a glass substrate of a liquid crystal panel with a TAB having a driving IC mounted thereon, or to connect a flexible wiring board of a liquid crystal display device with a printed wiring board, an anisotropic conductive film has been widely used which is produced by forming into a film shape a thermosetting resin composition containing a thermosetting epoxy resin, a polymerization initiator, and conductive particles. Normally, in such a case, the temperature for compression bonding is approximately 180° C. to 250° C., and the time for compression bonding is approximately 5 seconds to 10 seconds.

In recent years, in order to reduce thermal stress on an electrode portion of a flexible board or on an ITO electrode on a glass substrate of a liquid crystal panel, a reduction in compression bonding temperature during thermo-compression bonding using an anisotropic conductive film is required. Moreover, in order not only to reduce the thermal stress but also to improve production efficiency, a reduction in compression bonding time is required. To meet these requirements, an attempt has been made to use, instead of the thermosetting epoxy resin constituting the anisotropic conductive film, a polymerizable acrylic compound together with a film-forming resin, the polymerizable acrylic compound being capable of curing at a lower temperature in a shorter time than the thermosetting epoxy resin. In such a case, it has been proposed to use as a polymerization initiator an organic peroxide that does not produce gas as the self decomposition thereof proceeds (Patent Document 1). Specifically, an organic peroxide having a relatively low one-minute half-life temperature of approximately 100° C. to 130° C. is used. (Examples thereof include dibenzoyl peroxide (one-minute half-life temperature: 130° C.), dilauroyl peroxide (one-minute half-life temperature: 116.4° C.), and di-(3,5,5,-trimethylhexanoyl) peroxide (one-minute half-life temperature: 112.6° C.).)

[Patent Document 1] Japanese Patent Application Laid-Open No. 2006-199825.

DISCLOSURE OF THE INVENTION

Problems to be Solved by the Invention

Anisotropic conductive connection can be made using an anisotropic conductive film containing a polymerizable acrylic compound and the above-mentioned organic peroxide. However, when the anisotropic conductive film is compression bonded to an electronic component or a flexible board under the conditions of a compression bonding temperature of 130° C. or less and a compression bonding time of 3 seconds for the purpose of reducing the compression bonding temperature and the compression bonding time, the bonding strength of the anisotropic conductive film may be insufficient. Therefore, a problem arises in that sufficient connection reliability is not obtained. In such a case, although the polymerizable acrylic compound is used that can cure at a lower temperature in a shorter time than epoxy resin, the compression bonding temperature must be set to 150° C. or higher, and the compression bonding time must be set to 5 seconds or longer.

The present invention is intended to solve the above problems in the conventional technology. Accordingly, it is an object of the invention to achieve high bonding strength and good conduction reliability when anisotropic conductive connection is made under the conditions of a compression bonding temperature of at most 130° C. and a compression bonding time of at most 3 seconds while using an anisotropic conductive film in which a polymerizable acrylic resin that can cure at a relatively lower temperature in a shorter time than thermosetting epoxy resin is used together with a film-forming resin.

Means for Solving the Problems

The present inventors have found that the above object can be achieved by using, as the organic peroxide, two types of organic peroxides that do not produce oxygen gas resulting from the decomposition thereof and have different one-minute half-life temperatures. In this case, of the two types of organic peroxides, an organic peroxide that produces benzoic acid resulting from the decomposition thereof is used as an organic peroxide that has a higher one-minute half-life temperature. Thus, the present invention has been completed.

Accordingly, the present invention provides an anisotropic conductive film including a polymerizable acrylic compound, a film-forming resin, conductive particles, and a polymerization initiator, wherein the polymerization initiator contains two types of organic peroxides that do not produce oxygen gas resulting from the decomposition thereof and have different one-minute half-life temperatures, and wherein, of the two types of organic peroxides, one organic peroxide that has a higher one-minute half-life temperature produces benzoic acid resulting from the decomposition thereof.

The present invention also provides a connection structure, wherein anisotropic conductive connection is provided between a connection portion of a first wiring substrate and a connection portion of a second wiring substrate by means of the above-mentioned anisotropic conductive film. Moreover, the present invention provides a method for manufacturing a connection structure, the method including: holding the above-mentioned anisotropic conductive film between a connection portion of a first wiring substrate and a connection portion of a second wiring substrate; temporarily bonding the anisotropic conductive film to the connection portions of the first and second wiring substrates at a first temperature at which the organic peroxide having the lower one-minute half-life temperature dose not decompose; and subsequently bonding the anisotropic conductive film to the connection portions of the first and second wiring substrates by thermo-compression bonding at a second temperature at which the organic peroxide having the higher one-minute half-life temperature decomposes.

Effects of the Invention

In the anisotropic conductive film of the present invention, an organic peroxide that does not produce oxygen gas resulting from the decomposition thereof is used as the polymerization initiator for the polymerizable acrylic resin. Hence, gas is not produced during compression bonding, and therefore the connection reliability can be improved. Specifically, two types of organic peroxides having different one-minute half-life temperatures are used as the organic peroxide. An organic peroxide that decomposes to produce benzoic acid or a derivative thereof is used as one organic peroxide that has a higher one-minute half-life temperature (hereinbelow, such an organic peroxide may be referred to as a high-temperature decomposition peroxide). The presence of the other organic peroxide having a relatively lower one-minute half-life temperature (hereinbelow, the organic peroxide may be referred to as a low-temperature decomposition peroxide) allows the polymerizable acrylic compound to cure sufficiently when short-time thermo-compression bonding is performed at a relatively higher temperature at which the decomposition of the high-temperature decomposition peroxide is facilitated. Specifically, as the heating temperature increases, the low-temperature decomposition peroxide starts decomposing at a relatively lower temperature at which thermal stress is not required to be taken into account.

Subsequently, the high-temperature decomposition peroxide decomposes, and the curing of the polymerizable acrylic compound is finally completed. At this time, benzoic acid is produced. A part of the produced benzoic acid is present at the boundary between the cured anisotropic conductive film and the connecting object and in the vicinity of the boundary, whereby the bonding strength can be improved.

BEST MODE FOR CARRYING OUT THE INVENTION

Figure 1:
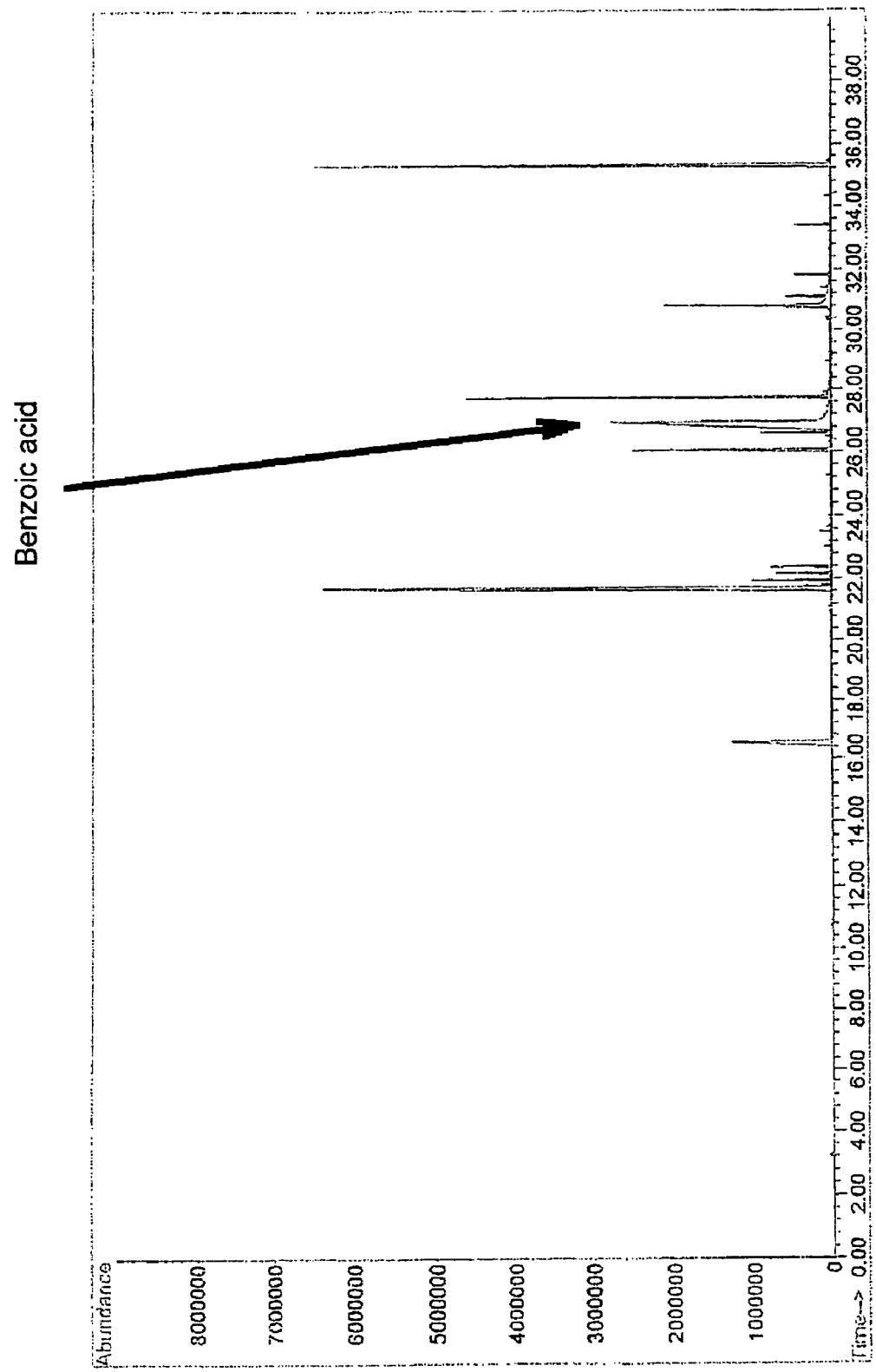
FIG. 1 is a GC-MS chart of an anisotropic conductive film sample of Example 1.

An anisotropic conductive film of the present invention contains a polymerizable acrylic compound, a film-forming rein, conductive particles, and a polymerization initiator. The polymerization initiator contains two types of organic peroxides that have different decomposition temperatures and do not produce oxygen gas resulting from the decomposition thereof. Of the two types of organic peroxides, one organic peroxide that has a higher one-minute half-life temperature produces benzoic acid or a derivative thereof when it decomposes. Examples of the derivative of benzoic acid include methyl benzoate, ethyl benzoate, and t-butyl benzoate.

In the present invention, when the one-minute half-life temperature of the other organic peroxide that is used as the polymerization initiator and has a lower one-minute half-life temperature is too low, the storage stability thereof before curing tends to be lowered. When the one-minute half-life temperature of the above organic peroxide is too high, the degree of curing of the anisotropic conductive film tends to be insufficient. Therefore, the one-minute half-life temperature of the above organic peroxide is preferably in the range of 80° C. or higher and less than 120° C., and more preferably in the range of 90° C. or higher and less than 120° C. Meanwhile, the one-minute half-life temperature of the commercial products of the organic peroxide having the higher one-minute half-life temperature is generally too high. When the one-minute half-life temperature of such an organic peroxide is too high, benzoic acid or a derivative thereof tends not to be produced at the intended thermo-compression bonding temperature. Therefore, the one-minute half-life temperature of the organic peroxide is preferably in the range of 120° C. or higher and 150° C. or lower.

When the difference in one-minute half-life temperature between the low-temperature decomposition peroxide and the high-temperature decomposition peroxide is too small, the low-temperature decomposition peroxide and the high-temperature decomposition peroxide react with the polymerizable acrylic compound. This tends to result in a reduction in the amount of benzoic acid contributing to the improvement of the bonding strength. When the difference is too large, the curing reactivity of the anisotropic conductive film at low temperature tends to decrease. Therefore, the difference is preferably in the range of 10° C. or higher and 30° C. or lower.

When the weight ratio of the low-temperature decomposition peroxide relative to the high-temperature decomposition peroxide is too small, the curing reactivity of the anisotropic conductive film at low temperature tends to decrease. When the weight ratio is too large, the bonding strength tends to decrease. Therefore, the weight ratio is preferably in the range of from 10:1 to 1:5.

Specific examples of the low-temperature decomposition peroxide which can be used in the present invention include diisobutyryl peroxide (one-minute half-life temperature: 85.1° C.), 1,1,3,3-tetramethylbutylperoxy-2-ethylhexanoate (one-minute half-life temperature: 124.3° C.), dilauroyl peroxide (one-minute half-life temperature: 116.4° C.), di-(3,5, 5,-trimethylhexanoyl) peroxide (one-minute half-life temperature: 112.6° C.), t-butylperoxypivalate (one-minute half-life temperature: 110.3° C.), t-hexylperoxypivalate (one-minute half-life temperature: 109.1° C.), t-butylperoxyneoheptanoate (one-minute half-life temperature: 104.6° C.), t-butylperoxyneodecanoate (one-minute half-life temperature: 103.5° C.), t-hexylperoxyneodecanoate (one-minute half-life temperature: 100.9° C.), di(2-ethylhexyl) peroxydicarbonate (one-minute half-life temperature: 90.6° C.), di(4-t-butylcyclohexyl) peroxydicarbonate (one-minute half-life temperature: 92.1° C.), 1,1,3,3-tetramethylbutylperoxyneodecanoate (one-minute half-life temperature: 92.1° C.), di-sec-butylperoxydicarbonate (one-minute half-life temperature: 85.1° C.), di-n-propylperoxydicarbonate (one-minute half-life temperature: 85.1° C.), and cumylperoxyneodecanoate (one-minute half-life temperature: 85.1° C.). These may be used in combination of two or more.

Specific examples of the high-temperature decomposition peroxide include di(4-methylbenzoyl) peroxide (one-minute half-life temperature: 128.2° C.), di(3-methylbenzoyl) peroxide (one-minute half-life temperature: 131.1° C.), dibenzoyl peroxide (one-minute half-life temperature: 130.0° C.), t-hexyl peroxybenzoate (one-minute half-life temperature: 160.3° C.), and t-butyl peroxybenzoate (one-minute half-life temperature: 166.8° C.). These may be used in combination of two or more. The use of these high-temperature decomposition peroxides having a phenyl ring can improve the cohesive force of the anisotropic conductive film, whereby the bonding strength can be further improved.

A combination of dilauroyl peroxide serving as the low-temperature decomposition peroxide and dibenzoyl peroxide serving as the high-temperature decomposition peroxide is preferred in terms of storage stability and bonding strength.

When the used amount of the polymerization initiator comprising the two different types of peroxides is too small in the anisotropic conductive film, the reactivity tends to be lost. When the used amount is too large, the cohesive force of the anisotropic conductive film tends to decrease. Therefore, the used amount of the polymerization initiator is preferably in the range of from 1 part by weight to 10 parts by weight, and more preferably in the range of from 3 parts by weight to 7 parts by weight, with respect to 100 parts by weight of the polymerizable acrylic compound.

The polymerizable acrylic compound used in the present invention is a compound having one or more acryloyl groups or methacryloyl groups (hereinafter collectively referred to as (meth)acryloyl groups), preferably two (meth)acryloyl groups. Note that the number of (meth)acryloyl groups in one molecule of the polymerizable acrylic compound is two or more, preferably two, in order to improve the conductive reliability.

Specific examples of the polymerizable acrylic compound include polyethylene glycol diacrylate, phosphoric ester type acrylate, 2-hydroxyethyl acrylate, 2-hydroxypropyl acrylate, 4-hydroxybutyl acrylate, isobutyl acrylate, t-butyl acrylate, isooctyl acrylate, bisphenoxyethanolfluorene diacrylate, 2-acryloyloxyethyl succinate, lauryl acrylate, stearyl acrylate, isobornyl acrylate, tricyclodecane dimethanol dimethacrylate, cyclohexyl acrylate, tris(2-hydroxyethyl) isocyanurate triacrylate, tetrahydrofurfuryl acrylate, o-phthalic acid diglycidyl ether acrylate, ethoxylated bisphenol A dimethacrylate, bisphenol A type epoxy acrylate, urethane acrylate, epoxy acrylate, and (meth)acrylates corresponding thereto.

When the amount of the polymerizable acrylic compound used in the anisotropic conductive film is too low, the conductive reliability tends to decrease. When the used amount is too large, the bonding strength tends to decrease. Therefore, the used amount of the polymerizable acrylic compound is preferably in the range of from 20 wt % to 70 wt %, and more preferably in the range of from 30 wt % to 60 wt %, based on the solid content of the resin.

Examples of the film-forming rein used in the present invention include thermosetting elastomers such as polyester resins, polyurethane resins, phenoxy resins, polyamides, and EVAs. Of these, the phenoxy resins are preferably used in terms of heat resistance and bonding properties.

When the amount of the film-forming rein used in the anisotropic conductive film is too small, the film is not formed. When the used amount is too large, the resin exclusion property for obtained the electrical connection tends to decrease. Therefore, the used amount of the film-forming rein is preferably in the range of from 10 wt % to 70 wt %, and more preferably in the range of from 30 wt % to 50 wt %, based on the solid content of the resin.

Conductive particles used in conventional anisotropic conductive films can be used as the conductive particles used in the present invention. Examples of such conductive particles include: metal particles such as gold particles, silver particles, and nickel particles; and metal-coated resin particles formed by coating the surface of particles of resins such as benzoguanamine resin and styrene resin with metals such as gold, nickel, and zinc. The average particle size of such conductive particles is normally in the range of from 1 µm to 10 µm and more preferably in the range of from 2 µm to 6 µm.

When the amount of the conductive particles used in the anisotropic conductive film is too small, conduction failure occurs. When the used amount is too large, a short circuit occurs. Therefore, the used amount of the conductive particles is preferably in the range of from 0.1 parts by weight to 20 parts by weight, and more preferably in the range of from 0.2 parts by weight to 10 parts by weight, with respect to 100 parts by weight of the solid content of the resin.

If necessary, the anisotropic conductive film of the present invention may contain diluting monomers such as various acrylic monomers, a filler, a softening agent, a coloring agent, a flame retardant, a thixotropic agent, a coupling agent, and the like.

The anisotropic conductive film of the present invention can be manufactured by the same method as that used for conventional anisotropic conductive films. For example, the anisotropic conductive film can be manufactured by uniformly mixing the polymerizable acrylic compound, the film-forming resin, the conductive particles, the polymerization initiator, and, if necessary, other additives with a solvent such as methyl ethyl ketone. Then, the mixture is applied to the surface of a release sheet having been subjected to releasing treatment, and the applied mixture is dried.

The anisotropic conductive film of the present invention can be preferably used for a connection structure in which anisotropic conductive connection is provided between a connection portion of a first wiring substrate and a connection portion of a second wiring substrate. No particular limitation is imposed on the first and second wiring substrates, and examples of the first and second wiring substrates include glass substrates of liquid crystal panels and flexible wiring substrates. Moreover, no particular limitation is imposed on the connection portions of the substrates. Connection portions to which a conventional anisotropic conductive film is applied may be used.

Such a connection structure can be manufactured by: holding the anisotropic conductive film of the present invention between the connection portions of the first and second wiring substrates; temporarily bonding the anisotropic conductive film to the connection portions of the first and second wiring substrates at a first temperature at which the organic peroxide having the lower one-minute half-life temperature dose not decompose; and bonding the anisotropic conductive film to the connection portions of the first and second wiring substrates by thermo-compression bonding at a second temperature at which the organic peroxide having the higher one-minute half-life temperature decomposes. Note that the organic peroxide having the lower one-minute half-life temperature, the organic peroxide having the higher one-minute half-life temperature, preferred one-minute half-life temperatures thereof, and a preferred temperature difference therebetween have already been described. Preferably, the first temperature is 20° C. lower than the one-minute half-life temperature of the organic peroxide having the lower one-minute half-life temperature, or lower. Preferably, the second temperature is 20° C. lower than the one-minute half-life temperature of the organic peroxide having the higher one-minute half-life temperature, or higher.

EXAMPLES

Hereinafter, the present invention will more specifically be described by way of Examples.

Example 1 and Comparative Examples 1 to 5

The components of each composition shown in the weight ratio in Table 1 were uniformly mixed by a routine method. Then, the mixture was applied to a polyester release film and was dried by blowing hot air at 70° C. for 5 minutes, whereby an anisotropic conductive film having a thickness of 30 µm was produced.

Each of the obtained anisotropic conductive films was measured for conduction resistance (Ω) by a four-point probe method in order to determine the degree of connection reliability. Specifically, a wiring pattern having a pitch of 200 µm was formed on a glass epoxy substrate using copper foil of 35 µm, and the anisotropic conductive film was bonded to the wiring pattern by thermo-compression bonding under the conditions of 80° C. and 1 MPa for 2 seconds. Then, the release PET was peeled off, whereby the anisotropic conductive film was temporarily bonded to the surface of the substrate. A copper wiring portion of a flexible wiring substrate was placed on the anisotropic conductive film. The flexible wiring substrate had a copper wiring pattern, having a pitch of 200 µm and a thickness of 8 µm, formed on a polyimide film having a thickness of 38 μm. Then, the anisotropic conductive film was compression bonded to the wiring portions over a length of 4 cm under the conditions of 130° C. and 3 MPa for 3 seconds or under the conditions of 190° C. and 3 MPa for 5 seconds, whereby connection structures for evaluation were obtained.

Each of the obtained connection structures was held in a thermostatic bath at a temperature of 85° C. and a humidity of 85% RH for 500 hours, and then the conduction resistance was measured using a multimeter. The results obtained are shown in Table 1. Each of the above wiring structures was subjected to a 90-degree peel test at a peeling rate of 50 mm/min to measure the bonding strength (N/cm). The results obtained are shown in Table 1. In practice, the bonding strength is desirably 6 N/cm or more.

Moreover, each of the anisotropic conductive films was subjected to DSC (differential scanning calorimetry) measurement at a temperature rising rate of 10° C./min. The results obtained are shown in Table 1.

In addition, the gas produced when the obtained anisotropic conductive film of Example 1 was heated at 135° C. was collected (−20° C., 15 minutes) and concentrated. The concentrated product was subjected to GC-MS measurement using a GC-MS apparatus (JHS100 (product of JAI CO., Ltd.) and HP6890/5973MS (product of Agilent)). The obtained GC-MS chart is shown in FIG. 1. As can be seen in FIG. 1, the absorption peak of benzoic acid was observed, and therefore the production of benzoic acid during compression bonding was confirmed.

tion initiator, a preferable bonding strength was obtained, but the conduction resistance was high and not preferable. In the anisotropic conductive film of Comparative Example 3 in which only dilauroyl peroxide was used as the polymerization initiator and to which benzoic acid was added, the bonding strength was low. When the polymerization initiator was not used and benzoic acid alone was used, the bonding strength was also low.

Moreover, in order to examine the effect of benzoic acid, a comparison was made between Comparative Examples 2, 4, and 1. In Comparative Example 2, only dibenzoyl peroxide, one molecule of which produces two benzoic acid molecules, was used. In Comparative Example 4, only t-butyl peroxybenzoate, one molecule of which produces one benzoic acid molecule, was used as the polymerization initiator. In Comparative Example 1, only dilauroyl peroxide, which does not produce benzoic acid, was used as the polymerization initiator. The results show that the bonding strength under the compression bonding conditions of 190° C. and 3 Mpa for 5 seconds was in the following order: Comparative Example 2>Comparative Example 4>Comparative Example 1. Therefore, it was found that the greater the number of produced benzoic acid molecules is, the higher the bonding strength becomes. Moreover, as can be seen from the results of Comparative Example 5 in which 2-ethylhexanoic acid was produced instead of benzoic acid, benzoic acid is better than 2-ethylhexanoic acid when used as a carboxylic acid useful for improving the bonding strength.

TABLE 1

|  | Ex. 1 | Comp. Ex. 1 | Comp. Ex. 2 | Comp. Ex. 3 | Comp. Ex. 4 | Comp. Ex. 5 |
|---|---|---|---|---|---|---|
| Bifunctional acrylate (A-200, Shin-Nakamura Chemical Corp.) | 30 | 30 | 30 | 30 | 30 | 30 |
| Phenoxy resin (YP50, Tohto Kasei Co., Ltd.) | 40 | 40 | 40 | 40 | 40 | 40 |
| Urethane acrylate (U-2PPA, Shin-Nakamura Chemical Corp.) | 20 | 20 | 20 | 20 | 20 | 20 |
| Phosphoric ester type acrylate (PM-2, Nippon Kayaku CO., Ltd.) | 5 | 5 | 5 | 5 | 5 | 5 |
| Ni particles (particle size, μm) | 2 | 2 | 2 | 2 | 2 | 2 |
| Dilauroyl peroxide | 3 | 6 | — | 3 | — | — |
| Dibenzoyl peroxide | 3 | — | 6 | — | — | — |
| Benzoic acid | — | — | — | 3 | — | — |
| t-Butyl peroxybenzoate | — | — | — | — | 6 | — |
| 1,1,3,3-Tetramethylbutyl-peroxy-2-ethylhexanoate | — | — | — | — | — | 6 |
| Conduction resistance [Ω]: 130° C. - 3 MPa - 3 sec | 0.089 | 0.101 | 4.5 (OPEN) | 0.099 | 6.1 (OPEN) | 0.092 |
| Bonding strength [N/cm]: 130° C. - 3 MPa - 3 sec | 7 | 4 | 2 | 3.5 | 2.2 | 4.2 |
| Bonding strength [N/cm]: 190° C. - 3 MPa - 5 sec | 7.8 | 4.1 | 7.2 | 4.3 | 5.3 | 4.5 |
| DSC starting temperature (° C.) | 70 | 60 | 82 | 63 | 105 | 67 |
| DSC peak temperature (° C.) | 90 | 80 | 105 | 85 | 120 | 83 |

As can be seen from Table 1, in the anisotropic conductive film of Example 1 in which dilauroyl peroxide (the low-temperature decomposition peroxide) and dibenzoyl peroxide (the high-temperature decomposition peroxide) were used as the polymerization initiator, the conduction resistance was small. Therefore, the conduction reliability was excellent, and the bonding strength was also excellent.

However, in the anisotropic conductive film of Comparative Example 1 in which only dilauroyl peroxide was used as the polymerization initiator, the bonding strength was low. In the anisotropic conductive film of Comparative Example 2 in which only dibenzoyl peroxide was used as the polymeriza-

INDUSTRIAL APPLICABILITY

The anisotropic conductive film of the present invention can provide anisotropic conductive connection at a low temperature in a short curing time. Therefore, the anisotropic conductive film can provide anisotropic conductive connection without causing thermal stress on a connection object and is useful for highly reliable anisotropic conductive connection for precision electronic components.

The invention claimed is:
1. An anisotropic conductive film comprising:
a polymerizable acrylic compound;

a film-forming resin;
conductive particles; and
a polymerization initiator, wherein
the polymerization initiator contains two organic peroxides that do not produce oxygen gas resulting from decomposition thereof and have different one-minute half-life temperatures,
of the two organic peroxides, one organic peroxide has a higher one-minute half-life temperature of 120° C. to 150° C. and produces benzoic acid or an ester thereof resulting from the decomposition of the one organic peroxide,
one other organic peroxide has a lower one-minute half-life temperature of 80° C. to 120° C., and
a weight ratio of the other organic peroxide that has a lower one-minute half-life temperature relative to the one organic peroxide that has the higher one-minute half-life temperature is in a range of from 10:1 to 1:5.

2. The anisotropic conductive film according to claim 1, wherein a difference in one-minute half-life temperature between the two types of organic peroxides that have different one-minute half-life temperatures is in a range of 10° C. to 30° C.

3. The anisotropic conductive film according to claim 1, wherein the other organic peroxide that has a lower one-minute half-life temperature is dilauroyl peroxide, and the one organic peroxide that has the higher one-minute half-life temperature is dibenzoyl peroxide.

4. The anisotropic conductive film according to claim 1, wherein the polymerizable acrylic compound is a phosphoric ester acrylate or an acrylate having a fluorine group.

5. The anisotropic conductive film according to claim 1, wherein the film-forming rein is a polyester resin, a polyurethane resin, or a phenoxy resin.

6. A method for manufacturing a connection structure, the method comprising:
holding the anisotropic conductive film according to claim 1 between a connection portion of a first wiring substrate and a connection portion of a second wiring substrate;
temporarily bonding the anisotropic conductive film to the connection portions of the first and second wiring substrates at a first temperature at which the other organic peroxide having the lower one-minute half-life temperature dose not decompose; and
subsequently bonding the anisotropic conductive film to the connection portions of the first and second wiring substrates by thermo-compression bonding at a second temperature at which the one organic peroxide having the higher one-minute half-life temperature decomposes.

* * * * *